(12) United States Patent
Zwanenburg et al.

(10) Patent No.: US 7,042,217 B2
(45) Date of Patent: May 9, 2006

(54) MAGNETIC RESONANCE METHOD

(75) Inventors: Jacobus Jan Marinus Zwanenburg, Eindhoven (NL); Willem Marten Prins, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 123 days.

(21) Appl. No.: 10/498,706

(22) PCT Filed: Dec. 16, 2002

(86) PCT No.: PCT/IB02/05464

§ 371 (c)(1),
(2), (4) Date: Jun. 14, 2004

(87) PCT Pub. No.: WO03/052440

PCT Pub. Date: Jun. 26, 2003

(65) Prior Publication Data
US 2005/0017718 A1    Jan. 27, 2005

(30) Foreign Application Priority Data
Dec. 17, 2001 (EP) ................................. 01204892

(51) Int. Cl.
*G01V 3/00* (2006.01)
(52) U.S. Cl. ...................... 324/309; 324/307
(58) Field of Classification Search ................ 324/309, 324/307, 306
See application file for complete search history.

(56) References Cited

U.S. PATENT DOCUMENTS 6,611,143 B1 * 8/2003 Kuhara ....................... 324/307
6,949,928 B1 * 9/2005 Gonzalez Ballester et al. ............................. 324/307

FOREIGN PATENT DOCUMENTS

WO    WO 00/72034 A1    11/2000
WO    WO 00/72050 A1    11/2000

OTHER PUBLICATIONS

Pruessman, et al.; Coil Sensitivity Encoding for Fast MRI; Proc. of ISMRM, 1998, pp. 579.
Pruessman, et al.; Coil Sensitivity Maps for Sensitivity Encoding and Intensity Correction; Proc. of ISMRM, 1998, pp. 2087.

(Continued)

*Primary Examiner*—Louis M. Arana
(74) *Attorney, Agent, or Firm*—Thomas M. Lundin

(57) ABSTRACT

A novel magnetic resonance imaging method is presented to produce a magnetic resonance image, wherein a stationary magnetic field and temporary magnetic gradient fields are applied. A sensitivity distribution (W(p)) maps the receiver sensitivity values of the receiver antennae system in an image domain. Transposition values (p(x)) map the positions in a spatial domain onto pixels (voxels) in the image domain on the basis of actual values of the stationary magnetic field and the temporary gradient fields. A folded image having aliased pixels (voxels) is then reconstructed from the magnetic resonance signals on the basis of a spatial encoding induced by the temporary magnetic field gradients. The aliased pixels (voxels) in the folded image are unfolded on the basis of the spatial receiver sensitivity map onto the respective signal distributions originating from different positions in the spatial domain so as to reconstruct the magnetic resonance image.

6 Claims, 4 Drawing Sheets

OTHER PUBLICATIONS

Figure 1:
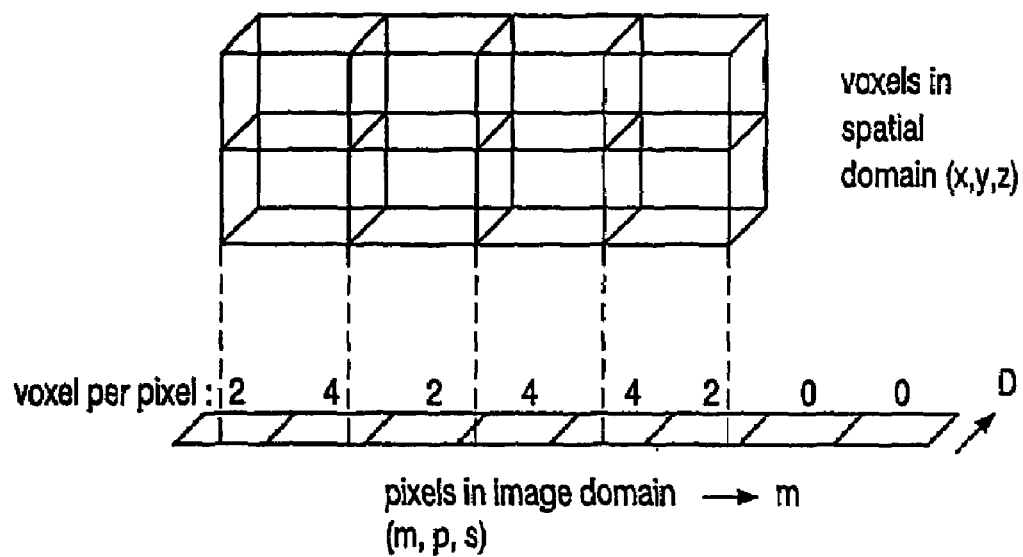

Weiger, et al.; Accellerated Cardiac Breathhold Imaging Using Coil Sensitivity Encoding; Proc. of ISMRM, 1998, pp. 799.

Weiger, et al.; Cardiac Real-Time Acquisition Using Coil Sensitivity Encoding; Proc. of ISMRM, 1998, p. 803.

Larkman, David, et al.; Elimination of Magnetic Field Foldover Artifacts in MR Images; J. of MRI, 2000, vol. 12, pp. 795-797.

* cited by examiner

MAGNETIC RESONANCE METHOD

The invention relates to a magnetic resonance method wherein a stationary magnetic field and temporary fields are applied, and wherein the magnetic resonance signals are acquired by an array of multiple receiver antennae like receiving coils, whereas normally aliasing in the magnetic image is obtained due to field inhomogeneities and/or fast sampling. The invention also relates to a magnetic resonance imaging apparatus for obtaining an image and to a computer program product.

In magnetic resonance imaging there is a general tendency to obtain acceptable images within shorter periods of time. For this reason the sensitivity encoding method called "SENSE" has recently been developed by the Institute of Biomedical Engineering and Medical Informations, University and ETH Zürich, Switzerland. The SENSE method is based on an algorithm which acts directly on the image as detected by the coils of the magnetic resonance apparatus. The subsequent encoding steps can be skipped and hence an acceleration of the signal acquisition for imaging by a factor of two to three can be obtained. Crucial for the SENSE method is the knowledge of the sensitivity of the coils which are arranged in so called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts pp. 579, 799, 803 and 2087).

The SENSE method is preferred for acceleration of the signal acquisition for magnetic resonance imaging resulting in an enormous reduction in operating time. However, the method can only be used properly if the coil sensitivity is exactly known. Otherwise imperfections will cause foldover artefacts (aliasing) which lead to incorrect images. In practice the coil sensitivity cannot be estimated perfectly and will be dependent on fluctuations in time (movement of the patient, temperature influences, etc.).

On the other hand foldover artefacts can arise when the same imaging frequency occurs both at a desired location within the slice and at another location within the sensitive region of the RF coil. Foldover artefacts can be caused by nonlinearity in the gradient system and by inhomogeneity in $B_0$. In the article in Journ. Magn. Res. Imaging No. 12 (2000), pp. 795–797 is described that foldover artefacts can be removed from images by separating the foldover data from the desired data. The noise level at the corrected pixels is strongly dependent on $|\Delta S|$, which is a measure of the linear independence of the signals in the images being combined for the correction. This can be used to restrict correction of the data from the imaging coil to only those regions that are adversely affected by the foldover artefacts to minimize loss of signal-to-noise ratio. The values of the sensitivity matrix (S) required are a measure of the basic field properties of a given scanner, so that the determination of the elements of S need not to be repeated for each examination for a given set of sequence parameters.

Although the values of the sensitivity matrix (S) depend on the basic field properties only, the above mentioned method requires these values in the image domain. As a consequence, the coil sensitivity matrix has to be determined for each different scan protocol. Also the uniform test object should have the size comparable to the object to be scanned and therefore this method cannot be used for whole-body scans. This method discriminates principally only two spatial positions measured from different coils and cannot be used for fast imaging like SENSE.

It is an object of the present invention to achieve a major reduction of artefacts in fast imaging techniques like SENSE and/or from field and gradient inhomogeneities.

This and other objects of the invention are achieved by a method as described herein, by an apparatus as described herein and by a computer program product as described herein.

The main aspect of the present invention is based on the idea to trace back artefacts from the pixels in the image domain to the co-ordinates of the spatial domain.

An important additional advantage of the method according to the invention is that only for a change of the position between the object or patient and the receiving coils a new reference scan has to be made.

Figure 2:
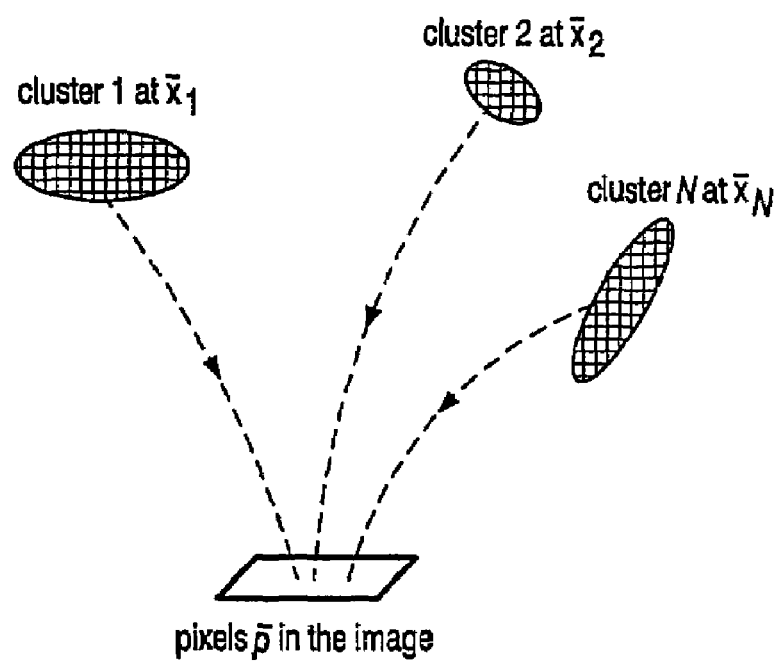
Figure 3:
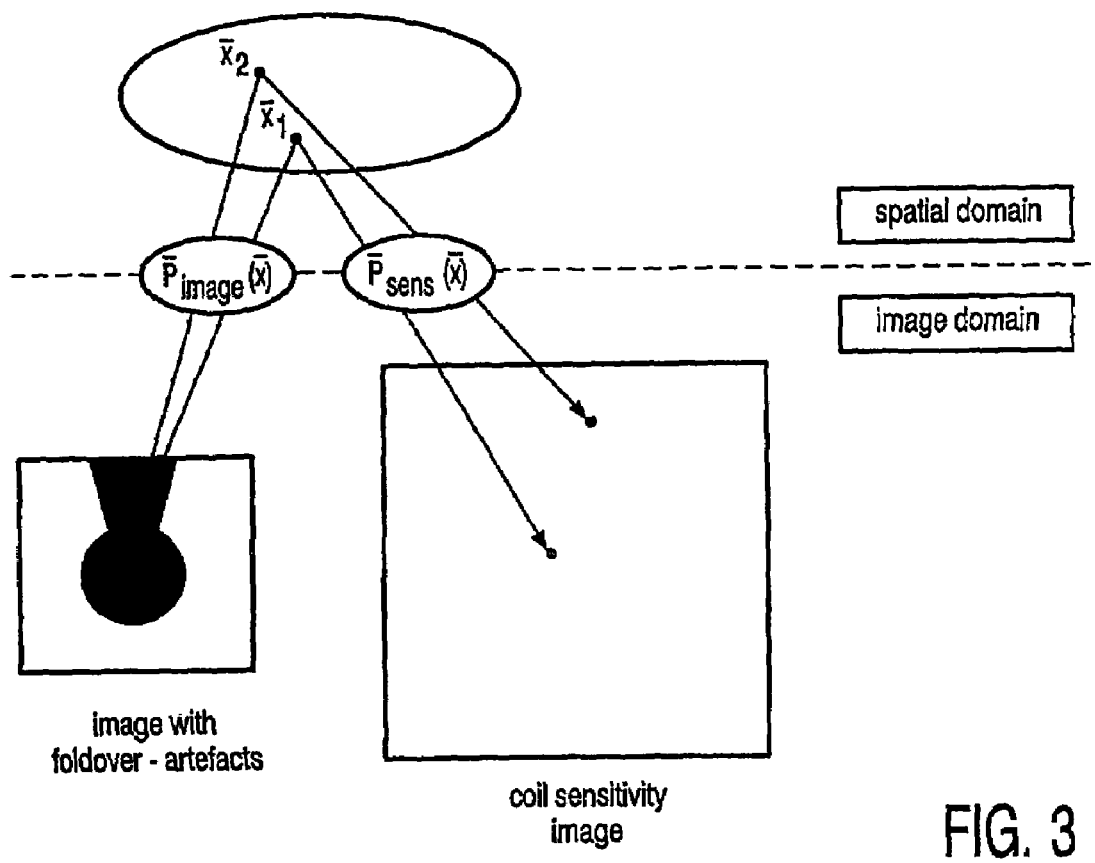
Figure 4:
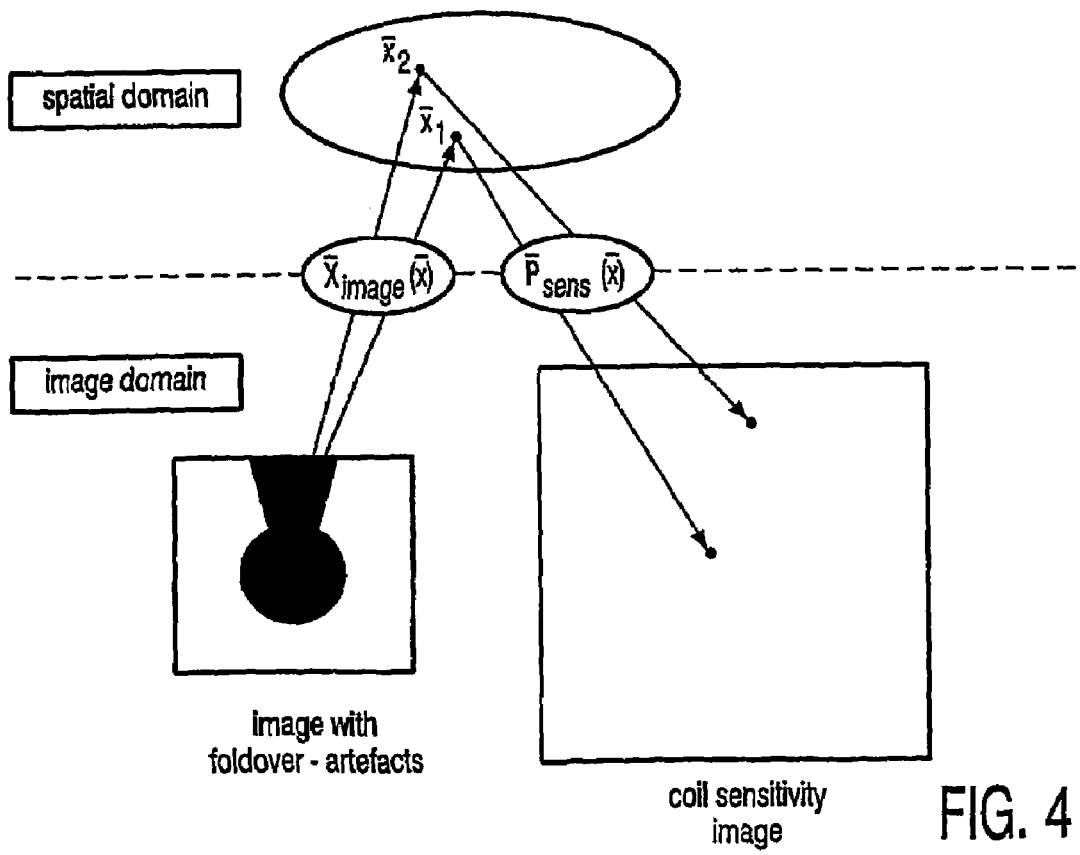
Figure 5:
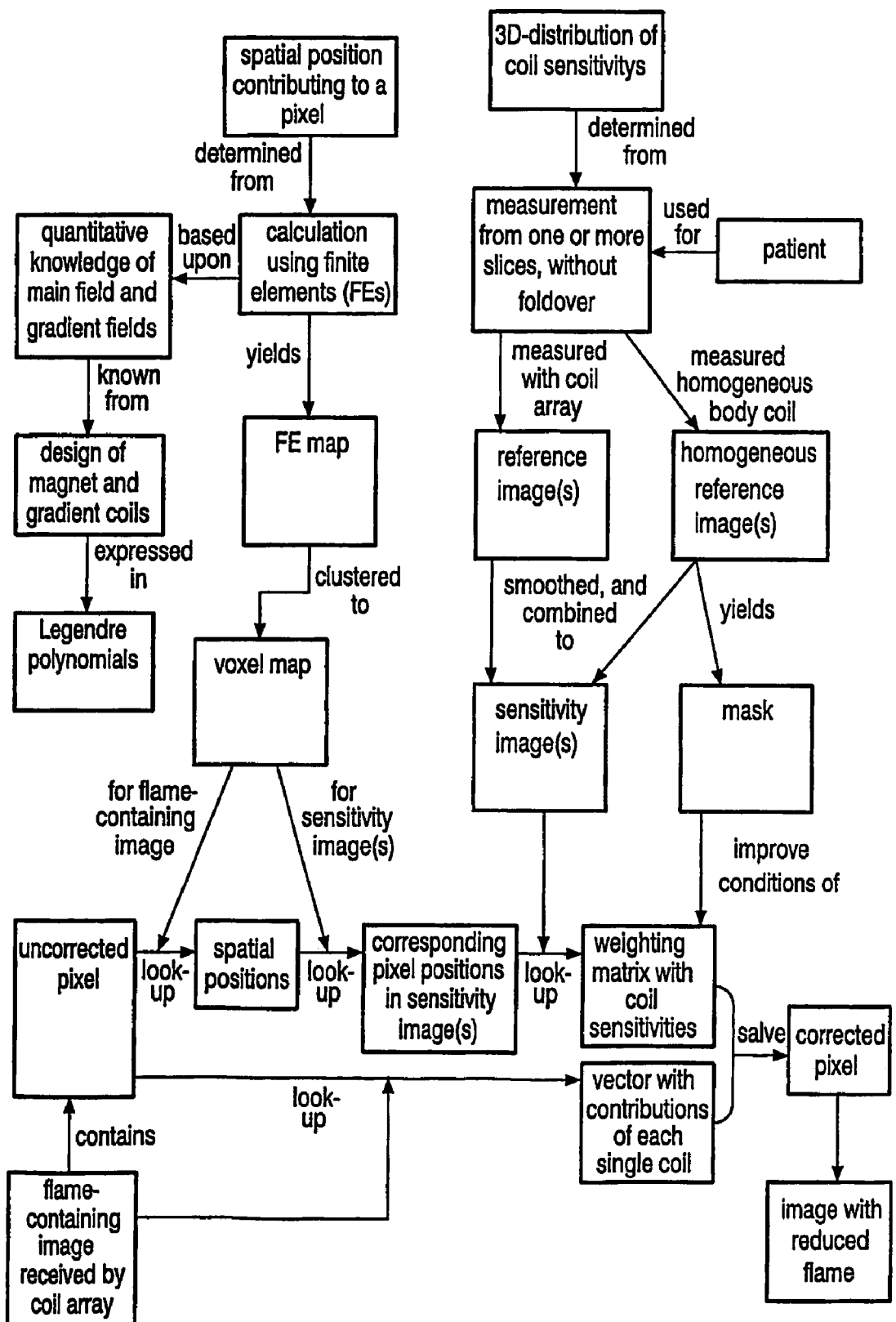
Figure 6:
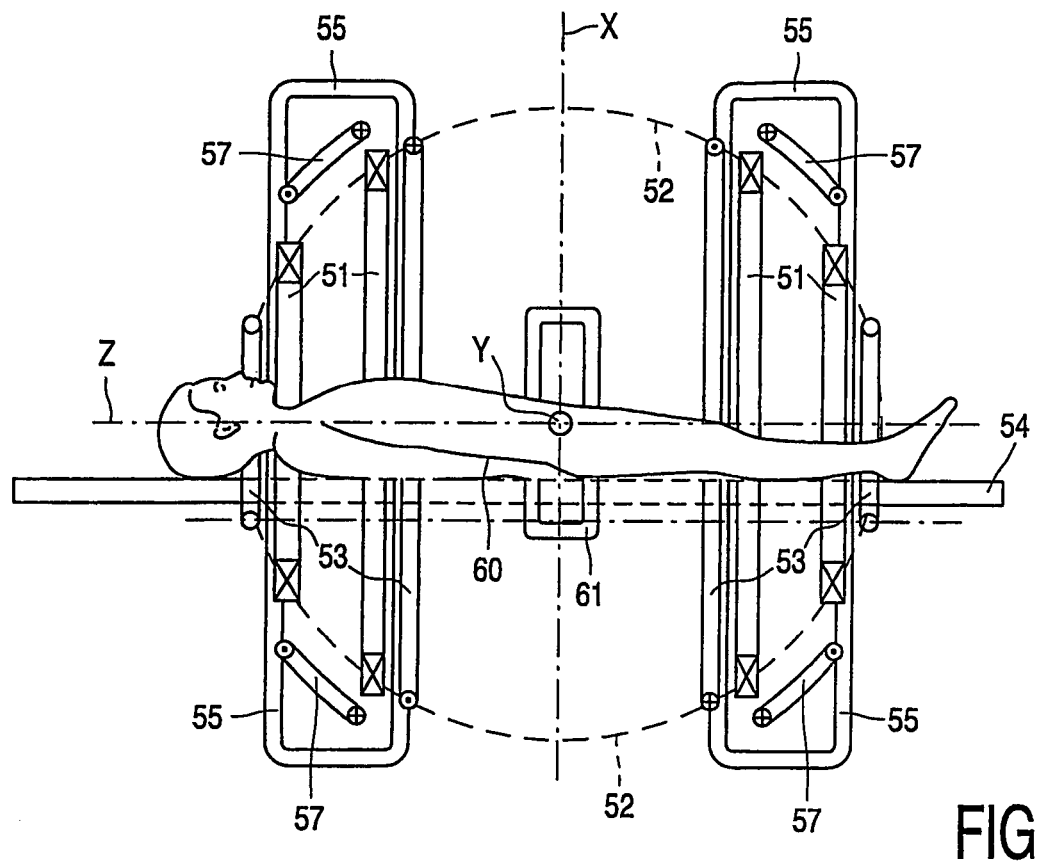
Figure 7:
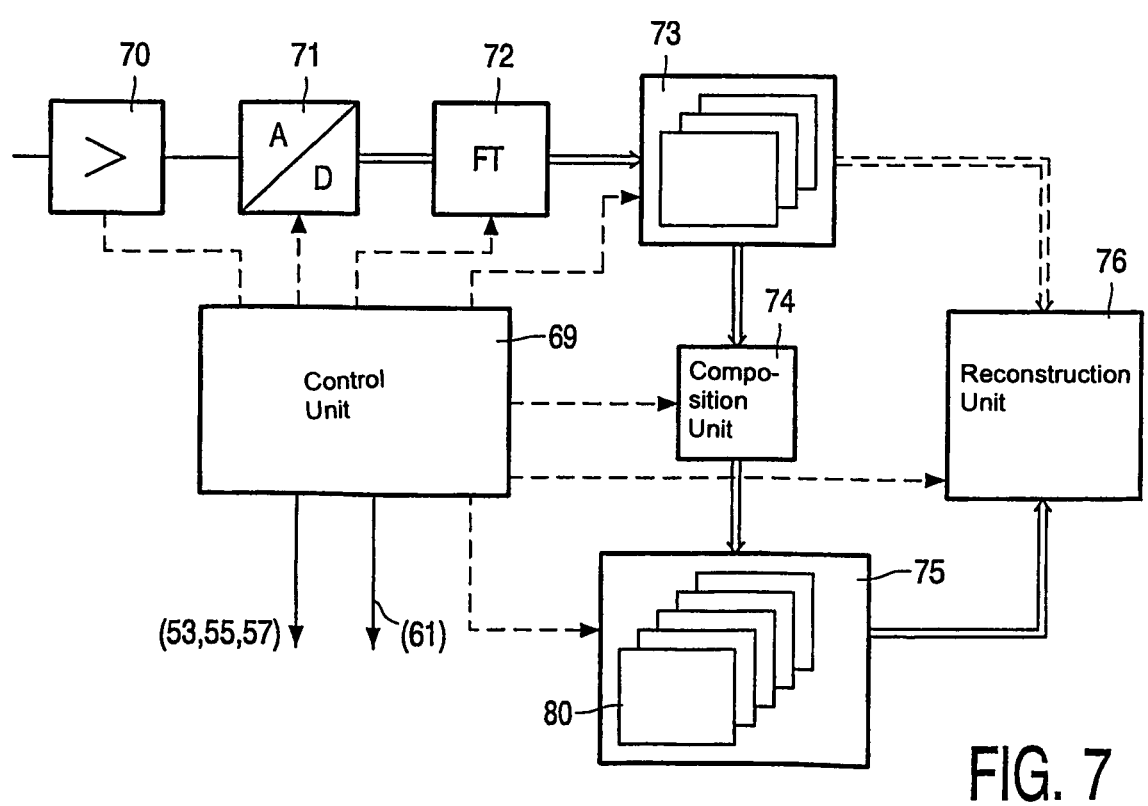

These and other advantages of the invention are disclosed in the following description in which an exemplified embodiment of the invention is described with respect to the accompanying drawings. Therein shows:

FIG. 1 the normal imaging of finite elements in the spatial domain onto pixels in the image domain, FIG. 2 clusters in the spatial domain which are imaged onto a pixel in the image domain, FIG. 3 the mappings from the spatial domain and the image domain for images with foldover artefacts and for coil sensitivity images, FIG. 4 the basic principle of separating the contributions of the different spatial positions from a specific pixel, FIG. 5 a flow diagram for the correction of flame artefacts, FIG. 6 an apparatus for carrying out the method in accordance with the present invention, and FIG. 7 a circuit diagram of the apparatus as shown in FIG. 6.

The term coil is used to denote a receiver antenna by which signals from spins excited by magnetic resonance are acquired.

In an image without foldover artefacts only one voxel in the spatial domain which is indicated by its center of gravity $x_1$ is imaged onto each pixel in the image domain. Supposing that the specific coil receives a signal from co-ordinate x with a sensitivity W(x) then the signal intensity S on pixel p in the image can be expressed as $$S(\vec{p}) = W(\vec{x}_1) \cdot I(\vec{x}_1) \qquad (1)$$

where I(x) is the spatial intensity, which is defined by the volume size $\delta V$ of the region that is imaged on the single pixel, by the spin density $\rho$, by the weighting of $T_1/T_2$ etc. S(p) is an estimate of the intensity I(x) for all co-ordinates x within the slice or volume asked for. It is supposed that the area is small enough in order to regard the center of gravity as being representative for the entire area. Generally the pixel position p is a non-linear function of the co-ordinate x since the magnets and the gradients are not perfect. Notably, the stationary magnetic field has actual values which are dependent on position and form the actual spatial distribution of the stationary magnetic field. Thus, the spin density in the image domain is a deformed image of the spin density in the spatial domain. In addition, this deformation is different for different scan protocols, as it is dependent on the gradient strength and the gradient direction.

In an image with foldover artefacts N different spatial regions will be imaged onto a single pixel in the image domain. These spatial regions can be characterized by their centers of gravity $x_1, x_2, \ldots x_N$. If M coils are used, which measure signals from point x with sensitivities $W_1(x)$, $W_2(x)$, ... $W_M(x)$, then the signal intensity at pixel p from coil j can be represented by $$S_j(\vec{p}) = W_j(\vec{x}_1) \cdot I(\vec{x}_1) + W_j(\vec{x}_2) \cdot I(\vec{x}_2) + \ldots + W_j(\vec{x}_N) \cdot I(\vec{x}_N) \quad (2)$$

sensitivities $W_1(x)$, $W_2(x)$, ... $W_M(x)$, then the signal intensity at pixel p from coil j can be represented by In order to obtain the coil sensitivity $W_j$ as a function of x the so called Coarse Calibration scan will be performed, in which the image will be measured twice: once with a coil as a reference which has per definition a homogeneous coil sensitivity and once with an array of coils of which the sensitivity should be determined.

The reference coil normally is a body coil. Provided that the images do not have any foldover artefacts, W can be determined by the following equation:

$$\left. \begin{array}{l} S_j(\vec{p}) = W_j(\vec{x}_1) \cdot I(\vec{x}_1) \\ S_{ref}(\vec{p}) = 1 \cdot I(\vec{x}_1) \end{array} \right\} \Rightarrow \frac{S_j(\vec{p})}{S_{ref}(\vec{p})} = \tilde{W}_j(\vec{p}(\vec{x}_1)) \quad (3)$$

The tilde in $W_j(p(x))$ means that the coil sensitivity as a function of p is only known in the image domain. Therefore $W_j(p)$ should be transformed to $W_j(x)$ by means of a mapping $p_{sens}(X)$, in which the relation between the spatial domain and the image domain is defined, considered for the scan protocol with which the coil sensitivity is determined. For this reason a part of the spatial domain will be subdivided into finite elements 1 or cubes with user defined dimensions as shown in FIG. 1. It is supposed that the center of each finite element is representative for the whole volume of the finite element. These finite elements 1 are projected onto the space (m,p) whereas m is the co-ordinate in the measuring direction and p is the co-ordinate in the phase encoding direction. By a computer program a map with co-ordinates will be obtained from the finite elements. The computer program is a modified version of the program FLAME which is available within Philips N.V. under internal code number XJS-154-0892 and is described in full detail in the diploma thesis "Reduction of Inhomogeneity related Foldover Artefacts in MR Imaging using Multiple Coil Encoding" of J. J. M. Zwanenburg at Technische Universiteit Delft. In fact the realistic field distribution with Legendre polynomials of any area x which is imaged onto a specific pixel p is computed by the computer program. The co-ordinates searched for are the centers of gravity with volume $\delta V(x_i)$ of the different areas which are mapped onto a single pixel. However, the above mentioned computer program provides not the centers of gravity but all finite elements which are mapped onto a single pixel. Thus also in an image without artefacts several finite elements are mapped onto a single pixel. The number of finite elements mapped is inter alia dependent on the size of the finite elements. Anyway, in order to define the number of artefacts the finite elements have to be clustered to a voxel as shown in FIG. 2. It is supposed that cluster 1 at position $x_1$ is the original signal which is transmitted from the spin density to be measured, whereas clusters 2 and 3 are signals from artefacts. The differentation between related finite elements and finite elements which form a separate cluster (voxel) will be determined by the computer program. A criterion to distinguish between the different groups of finite elements is that the finite elements of a single cluster form a connected region. For each coil a three-dimensional table of $W_j(p)$ is available, from which the matrix $W_j(x_i)$ can be composed for each pixel in the image with foldover artefacts. The matrix $W_j(x_i)$ is thereby acquired by means of the co-ordinates $x_1$, $x_2$, ... $x_N$ as calculated with the finite elements (FE) method described above and by means of the map $p_{sens}(x)$. Equation (2) can be solved directly or by least-square algorithm if more coils are available than foldover artefacts. It should be checked every time if a newly introduced row in the matrix $W_j(x_i)$ has not been made ill-conditioned or zero. After correction there remains a collection of co-ordinates $x_1(p)$ in the spatial domain, i.e. for every pixel the co-ordinates of the point $x_i(p)$ closest to the point that would be mapped on pixel p if an ideal magnet and perfect gradients would be available, on which I(x) is computed. This distribution I(x) can be presented in two different manners: at pixel position p in the non-linear original image, or in a linearized image, at a pixel position that is a linear function of x. In both cases, the image intensity should be corrected for variation of intensity arising from varying of the volume size $\delta V$. The correction by such a linear image is slightly more complicated and is only of interest if also a geometrical correction is required.

FIG. 3 shows the mapping between the spatial domain and the image domain for an image with foldover artefacts (left) and for an image with the coil sensitivity profiles, for N=2. The map p (x) is dependent on the scan protocol. Therefore a difference has to be made between the mapping between the spatial domain and the image domain, valid for the image with foldover artefacts, $p_{image}(x)$, and the mapping between the spatial domain and the image domain, valid for the coil sensitivity image, $p_{sens}(x)$. When an image with foldover artefacts is made, in principle several points $x_1$, $x_2$ ... $x_N$ are imaged onto a single pixel p. When the coil sensitivity images are made, care is taken that only a single point x is imaged onto a single pixel p—i.e. there exists for each coil sensitivity image a one-to-one relation $p_{sens}(x)$. Therefore, the FOV of the coil sensitivity images must be larger than the FOV of the image with the folder-over artefacts, since the same area of the spatial domain has to be imaged, whereas a single pixel does not represent several areas from the spatial domain. In order to correct the image there must be provided a relationship between each pixel in the image with foldover artefacts $p_{image}(x)$ and the pixels $p_{sens}(x_1)$, $p_{sens}(x_2)$, ... , $p_{sens}(x_N)$ in the coil sensitivity image.

The solution to this problem is depicted in FIG. 4, which shows the mapping $x_{image}(p)$ from the image domain to the spatial domain for the image with foldover artefacts and in return the mapping $p_{sens}(x)$ from the spatial domain to the image domain for the different coil sensitivities, again for N=2. The map $x_{image}(p)$ which is the inverse of $p_{image}(x)$, can be determined by the above mentioned computer program. From the map $x_{image}(p)$ follow the points $x_1$ and $x_2$ which are mapped onto the same pixel p. From the map $p_{sens}(x)$ and the points $x_1$ and $x_2$ follow the pixel positions in the coil sensitivity image. The coil sensitivity in the points $x_1$ and $X_2$ thus can be derived according to the following equation $$\tilde{W}(\vec{p}_{sens}(\vec{x})) = W(\vec{x}) \quad (4)$$

This equation (4) delivers only a proper correction if $p_{sens}(x)$ is a one-to-one function which is true as no foldover artefacts are produced by making the reference scan (cf. equation (3)).

In FIG. 5 the flow diagram of the computer program is shown. Thereby the spatial positions 11 which contribute to a single pixel are determined by calculation 12 of the Finite Elements (FE's) and are stored in a FE map 13. The calculation itself is based upon the quantitative knowledge 14 of the main field and of the gradient fields, which is known from the design parameters 15 of the magnet for the basic magnet field $B_0$ and of the gradient coils. These design parameters are mathematically determined by their Legendre polynomials 16. The FE map 13 will then be clustered to a voxel map 17. On the other hand the three-dimensional distribution of the coil sensitivities 20 will be determined from the measurement 21 from one or more slices without foldover artefacts which data was measured at a patient 22. According to equation (3) reference images 23 are measured with the coil array and one or more homogeneous reference images 24 are measured with a homogeneous body coil. From these images 23 and 24 coil sensitivity images 25 and also a mask 26 are yielded.

The spatial positions 29 of the uncorrected pixels 27 from the flame or foldover artefacts containing image 28 are looked up in the voxel map 17 for the flame containing image. The spatial positions are transformed to pixel positions 30 in the sensitivity images 25 by looking them up in the voxel map 17 for the reference images. According to equation (4), from the sensitivity images 25 the weighting matrix 31 with the coil sensitivities can be computed, the condition of which can be improved by mask 26. Directly from the uncorrected pixels 27 from the flame-containing image 28 a vector 32 with contributions from each single coil can be computed. By solving matrix equation (2), in which the weighting matrix 31 and the vector 32 occur, the corrected pixels 33 are obtained which constitute image 34 with reduced or erased flame or foldover artefacts.

It should be noted that both foldover artefacts caused by field inhomogeneities or by the SENSE acquisition in inhomogeneous fields can be handled by the method as described above in order to obtain a better image.

The apparatus shown in FIG. 6 is an MR apparatus which comprises a system of four coils 51 for generating a steady, uniform magnetic field whose strength is of the order of magnitude of from some tenths of Tesla to some Tesla. The coils 51, being concentrically arranged relative to the z axis, may be provided on a spherical surface 52. The patient 60 to be examined is arranged on a table 54 which is positioned inside these coils. In order to produce a magnetic field which extends in the z direction and linearly varies in this direction (which field is also referred to hereinafter as the gradient field), four coils 53 are provided on the spherical surface 52. Also present are four coils 57 which generate a gradient field which also extends (vertically) in the x direction. A magnetic gradient field extending in the z direction and having a gradient in the y direction (perpendicularly to the plane of the drawing) is generated by four coils 55 which may be identical to the coils 57 but are arranged so as to be offset 90° in space with respect thereto. Only two of these four coils are shown here.

Because each of the three coil systems 53, 55, and 57 for generating the magnetic gradient fields is symmetrically arranged relative to the spherical surface, the field strength at the centre of the sphere is determined exclusively by the steady, uniform magnetic field of the coil 51. Also provided is an RF coil 61 which generates an essentially uniform RF magnetic field which extends perpendicularly to the direction of the steady, uniform magnetic field (i.e. perpendicularly to the z direction). The RF coil receives an RF modulated current from an RF generator during each RF pulse. The RF coil 61 can also be used for receiving the spin resonance signals generated in the examination zone.

As is shown in FIG. 7 the MR signals received in the MR apparatus are amplified by a unit 70 and transposed in the baseband. The analog signal thus obtained is converted into a sequence of digital values by an analog-to-digital converter 71. The analog-to-digital converter 71 is controlled by a control unit 69 so that it generates digital data words only during the read-out phase. The analog-to-digital converter 71 is succeeded by a Fourier transformation unit 72 which performs a one-dimensional Fourier transformation over the sequence of sampling values obtained by digitization of an MR signal.

The raw data thus produced by Fourier transformation is written into a memory 73 whose storage capacity suffices for the storage of several sets of raw data From these sets of raw data a composition unit 74 generates a composite image in the described manner; this composite image is stored in a memory 75 whose storage capacity suffices for the storage of a large number of successive composite images 80. A reconstruction unit 76 produces MR images from the sets of data thus acquired, said MR images being stored.

The units 70 to 76 are controlled by the control unit 69. As denoted by the downwards pointing arrows, the control unit also imposes the variation in time of the currents in the gradient coil systems 53, 55 and 57 as well as the central frequency, the bandwidth and the envelope of the RF pulses generated by the RF coil 61. The memories 73 and 75 as well as the MR image memory (not shown) in the reconstruction unit 76 can be realized by way of a single memory of adequate capacity. The Fourier transformation unit 72, the composition unit 74 and the reconstruction unit 76 can be realized by way of a data processor well-suited for running a computer program according to the above mentioned method.

The invention claimed is:

1. A magnetic resonance imaging method to produce a magnetic resonance image, wherein
   a stationary magnetic field is applied
   the stationary magnetic field having an actual spatial distribution
   temporary gradient fields are applied,
   magnetic resonance signals are acquired by means of a receiver antennae system,
   the magnetic resonance signals being spatially encoded on the basis of the temporary gradient fields,
   the receiver antennae system having receiver sensitivity values,
   a folded image having aliased pixels (voxels) is reconstructed from the magnetic resonance signals on the basis of the spatial encoding on the basis of the temporary gradient fields,
   the magnetic resonance image is reconstructed by unfolding the aliased pixels (voxels) of the folded image on the basis of the receiver sensitivity values and the actual spatial distribution of the stationary magnetic field.

2. A magnetic resonance imaging method as claimed in claim 1 wherein
   the stationary magnetic field and temporary magnetic gradient fields are applied;
   a sensitivity distribution (W(p)) maps the receiver sensitivity values of the receiver antennae system in an image domain,
   transposition values (p(x)) map the positions in a spatial domain onto pixels (voxels) in the image domain on the basis of actual values of the stationary magnetic field and the temporary gradient fields, the folded image having aliased pixels (voxels) is reconstructed from the magnetic resonance signals on the basis of a spatial encoding induced by the temporary magnetic field gradients, which aliased pixels (voxels) comprise signal distributions from substantially different positions in the spatial domain, and the aliased pixels (voxels) in the folded image are unfolded on the basis of the spatial receiver sensitivity map onto the respective signal distributions originating from different positions in the spatial domain so as to reconstruct the magnetic resonance image, which spatial receiver sensitivity map being composed from the image domain receiver sensitivity map composed with the transposition values.

3. Magnetic resonance imaging method according to claim 2, wherein:

in a receiver sensitivity map $W(p)$) the receiver sensitivity values are collected, in a transposition map ($p_{sens}(x)$) the transposition values are collected, a spatial receiver sensitivity map of the spatial receiver sensitivity values is formed by composing the receiver sensitivity map with the transposition map.

4. A magnetic resonance imaging method according to claim 3, wherein at least two antennae record signals ($S(p)$) originating from the same imaging position are weighted with the sensitivity factor ($W_1(x), W_2(x), \ldots, W_M(x)$) of the respective antenna and the image intensity ($I(x)$) and the pixels (voxels are reconstructed from the weighted signals.

5. A magnetic resonance imaging apparatus for obtaining an image from a plurality of signals comprising means for applying a stationary magnetic field and temporary magnetic gradient fields;

means for providing a sensitivity distribution ($W(p)$) which maps the receiver sensitivity values of the receiver antennae system in an image domain, means for providing transposition values ($p(x)$) which map the positions in a spatial domain onto pixels (voxels) in the image domain on the basis of actual values of the stationary magnetic field and the temporary gradient fields, means for reconstruction of a folded image having aliased pixels (voxels) from the magnetic resonance signals on the basis of a spatial encoding induced by the temporary magnetic field gradients, which aliased pixels (voxels) comprise signal distributions from substantially different positions in the spatial domain, and means for unfolding the aliased pixels (voxels) in the folded image on the basis of the spatial receiver sensitivity map onto the respective signal distributions originating from different positions in the spatial domain so as to reconstruct the magnetic resonance image, which spatial receiver sensitivity map being composed from the image domain receiver sensitivity map composed with the transposition values.

6. A computer program product stored on a computer usable medium for forming an image by means of the magnetic resonance method, comprising a computer readable program means for causing the computer to control the execution of:

applying a stationary magnetic field and temporary magnetic gradient fields;

providing a sensitivity distribution ($W(p)$) which maps the receiver sensitivity values of the receiver antennae system in an image domain, providing transposition values ($p(x)$) which map the positions in a spatial domain onto pixels (voxels) in the image domain on the basis of actual values of the stationary magnetic field and the temporary gradient fields, reconstructing a folded image having aliased pixels (voxels) from the magnetic resonance signals on the basis of a spatial encoding induced by the temporary magnetic field gradients, which aliased pixels (voxels) comprise signal distributions from substantially different positions in the spatial domain, and unfolding the aliased pixels (voxels) in the folded image on the basis of the spatial receiver sensitivity map onto the respective signal distributions originating from different positions in the spatial domain so as to reconstruct the magnetic resonance image, which spatial receiver sensitivity map being composed from the image domain receiver sensitivity map composed with the transposition values.

* * * * *